(12) United States Patent
Lin

(10) Patent No.: US 11,408,929 B2
(45) Date of Patent: Aug. 9, 2022

(54) THROUGH-SILICON VIA DETECTING CIRCUIT, METHOD AND INTEGRATED CIRCUIT HAVING THE SAME

(71) Applicant: Changxin Memory Technologies, Inc., Anhui (CN)

(72) Inventor: You-Hsien Lin, Hefei (CN)

(73) Assignee: Changxin Memory Technologies, Inc., Hefei (CN)

(\*) Notice: Subject to any disclaimer, the term of this patent is extended or adjusted under 35 U.S.C. 154(b) by 0 days.

(21) Appl. No.: 17/215,386

(22) Filed: Mar. 29, 2021

(65) Prior Publication Data
US 2021/0215755 A1 Jul. 15, 2021

Related U.S. Application Data

(63) Continuation of application No. PCT/CN2019/118464, filed on Nov. 14, 2019.

(30) Foreign Application Priority Data

Nov. 16, 2018 (CN) .......................... 201811367326.2
Nov. 16, 2018 (CN) .......................... 201821891408.2

(51) Int. Cl.
*G01R 31/28* (2006.01)

(52) U.S. Cl.
CPC ..... *G01R 31/2853* (2013.01); *G01R 31/2884* (2013.01)

(58) Field of Classification Search
CPC . G01R 31/2853; G01R 31/2884; G01R 31/28
(Continued)

(56) References Cited

U.S. PATENT DOCUMENTS 8,803,545 B2   8/2014  Yoko et al.
9,086,455 B2   7/2015  Lai et al.
(Continued)

FOREIGN PATENT DOCUMENTS

CN   103165577 A   6/2013
CN   104425411 A   3/2015
(Continued)

OTHER PUBLICATIONS

PCT International Search Report and the Written Opinion dated Feb. 12, 2020, issued in related International Application No. PCT/CN2019/118464 (10 pages).

*Primary Examiner* — Giovanni Astacio-Oquendo
(74) *Attorney, Agent, or Firm* — Sheppard Mullin Richter & Hampton LLP

(57) ABSTRACT

A through-silicon via (TSV) detecting circuit, a detecting method, and an integrated circuit having the same are disclosed. The TSV detecting circuit includes: an input circuit including a first switching circuit, the first switching circuit comprising a control terminal coupled to a first detection control signal, a first terminal coupled to a first power signal, and a second terminal coupled to a first terminal of a TSV, wherein the first switching circuit is configured to be turned on in response to the first detection control signal to transmit a first power signal to the first terminal of the TSV; and a comparison circuit comprising a first input coupled to a second terminal of the TSV, and a second input coupled to a reference signal, wherein the comparison circuit is configured to compare a signal of the second terminal of the TSV and the reference signal.

20 Claims, 9 Drawing Sheets

(58) Field of Classification Search
USPC .............. 324/762.03, 762.01, 537, 500
See application file for complete search history.

(56) References Cited

U.S. PATENT DOCUMENTS

| | | | |
|---|---|---|---|
| 9,208,898 B2 | 12/2015 | Jeong | |
| 9,607,925 B2 | 3/2017 | Yun et al. | |
| 10,594,304 B2* | 3/2020 | Takatsuka | H04N 5/3745 |
| 2014/0266291 A1 | 9/2014 | Fkih et al. | |
| 2017/0219647 A1* | 8/2017 | Yun | H03K 17/6872 |
| 2020/0169170 A1* | 5/2020 | Zhang | H02M 3/158 |
| 2021/0239751 A1* | 8/2021 | Lin | G01R 31/2882 |
| 2022/0046202 A1* | 2/2022 | Hino | H04N 5/37457 |

FOREIGN PATENT DOCUMENTS

| | | |
|---|---|---|
| CN | 105045158 A | 11/2015 |
| CN | 106771985 A | 5/2017 |
| CN | 209446727 U | 9/2019 |

* cited by examiner

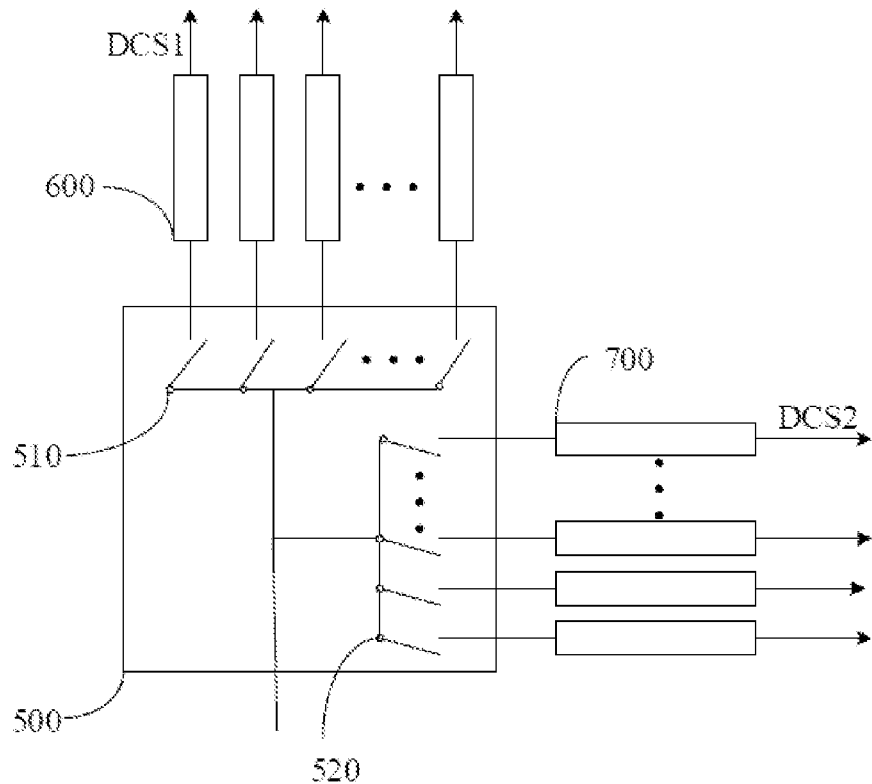

Fig. 13

| | |
|---|---|
| turning on a first switching circuit by using a first detection control signal, so that a first power signal is transmitted to a first input of a comparison circuit via the first switching circuit and a TSV | S1 |
| transmitting a reference signal to a second input of the comparison circuit | S2 |
| comparing signals input into the first input and the second input of the comparison circuit so as to determine whether the TSV is faulty | S3 |

Fig. 14

THROUGH-SILICON VIA DETECTING CIRCUIT, METHOD AND INTEGRATED CIRCUIT HAVING THE SAME

CROSS-REFERENCE TO RELATED APPLICATIONS

This application is a continuation application of International Patent Application No. PCT/CN2019/118464, filed on Nov. 14, 2019, which is based on and claims priority to and benefits of the Chinese Patent Applications No. 201811367326.2 and No. 201821891408.2, both filed with the China National Intellectual Property Administration (CNIPA) of the People's Republic of China on Nov. 16, 2018. The entire content of the above-referenced applications are incorporated herein by reference.

TECHNICAL FIELD

The present disclosure relates to the field of integrated circuit technology and, in particular, to a through-silicon via (TSV) detecting circuit, and a method and an integrated circuit having the same.

BACKGROUND

With the development and advancement of technology, three-dimensional (3D) integrated circuit (IC) chips are more and more popular. The 3D chips use TSVs to connect a plurality of layers of chips. The TSVs may be susceptible to failures during manufacturing and bonding, and the TSV failures will affect the performance of the 3D chips.

At present, for 3D integrated circuits with a small number of TSVs, often no interposers are arranged in the crossing layers. However, for 3D integrated circuits with a large number of TSVs, interposers are usually arranged in the crossing layer structure, and a plurality of crossing layers may communicate with each other through the TSVs. However, the TSVs may be susceptible to failures during manufacturing and bonding. Thus, the TSV connectivity needs to be detected.

It is to be noted that the above information disclosed in this Background section is only for enhancement of understanding of the background of the invention and therefore may contain information that does not form the prior art already known to a person of ordinary skill in the art.

SUMMARY OF THE INVENTION

The embodiments of the present disclosure present a through-silicon via (TSV) detecting circuit, a TSV detecting method, and an integrated circuit having the same, which can detect connectivity of the through-silicon vias in a 3D integrated circuit.

One aspect of the present disclosure is directed to a through-silicon via (TSV) detecting circuit. The TSV detecting circuit may comprise: an input circuit including a first switching circuit, wherein the first switching circuit may comprise a control terminal coupled to a first detection control signal, a first terminal coupled to a first power signal, and a second terminal coupled to a first terminal of a TSV, and may be configured to be turned on in response to the first detection control signal to transmit the first power signal to the first terminal of the TSV; and a comparison circuit comprising a first input coupled to a second terminal of the TSV, and a second input coupled to a reference signal, wherein the comparison circuit may be configured to compare a signal of the second terminal of the TSV and the reference signal.

According to one exemplary embodiment of the present disclosure, the input circuit may be disposed on a first chip layer of an integrated circuit, the comparison circuit may be disposed on a second chip layer the integrated circuit, and the first chip layer and the second chip layer may be connected through the TSV.

According to one exemplary embodiment of the present disclosure, the first chip layer is provided with N input circuits and N TSV arrays, each of the N input circuits is coupled to a first terminal of each of the N TSV arrays, a second terminal of each of the N TSV arrays is coupled to the first input of the comparison circuit, and each of the N TSV arrays comprises at least a TSV.

According to one exemplary embodiment of the present disclosure, the comparison circuit may comprise N comparison circuits, each of the N comparison circuits may comprise a first input coupled to the second terminal of each of the N TSV arrays and a second input coupled to the reference signal.

According to one exemplary embodiment of the present disclosure, the TSV detecting circuit may further comprise N output circuits, each of the N output circuits comprising a second switching circuit, a first terminal of the second switching circuit of each of the N output circuits coupled to the second terminal of each of the N TSV arrays, a second terminal of the second switching circuit of each of the N output circuits coupled to the first input of each of the N comparison circuits.

According to one exemplary embodiment of the present disclosure, each of the N output circuits may comprise a flip-flop coupled to an output control signal, a clock signal, and a first node, and may be configured to transmit the output control signal to the first node in response to the clock signal. The second switching circuit may be coupled to the first node, and may be configured to be turned on in response to an output signal of the flip-flop to transmit a signal of the second terminal of each of the N TSV arrays to the first input of the comparison circuit.

According to one exemplary embodiment of the present disclosure, an input of the flip-flop of each of the N output circuits may be coupled to the output control signal.

According to one exemplary embodiment of the present disclosure, an output of the flip-flop of each of the N output circuits may be connected to an input of the flip-flop of an immediately succeeding output circuit.

According to one exemplary embodiment of the present disclosure, the input circuit may further comprise a third switching circuit comprising a control terminal coupled to a second detection control signal, a first terminal coupled to the second terminal of the first switching circuit, and a second terminal coupled to the first terminal of the TSV. The third switching circuit may be configured to be turned on in response to the second detection control signal to transmit a signal of the second terminal of the first switching circuit to the first terminal of the TSV.

According to one exemplary embodiment of the present disclosure, the TSV detecting circuit may further comprise M*N input circuits, each of the M*N input circuits may be coupled to the first terminal of each of M*N TSVs. The M*N TSVs may include the N TSV arrays, each of the N TSV arrays may have M TSVs connected in series, the M TSVs in each of the N TSV arrays may be respectively disposed on M chip layers of the integrated circuit, and the second terminal of each of the N TSV arrays may be coupled to an output circuit. The first terminal of each of the N TSV arrays may be an input, and the second terminal of each of the TSV arrays may be an output.

According to one exemplary embodiment of the present disclosure, the TSV detecting circuit may further comprise a selection circuit configured to select, according to a selection control signal, one or more groups of M chip layers and one or more groups of N TSV arrays, wherein the M chip layers comprise at least one group of chip layers that includes at least one chip layer, and wherein the N TSV arrays comprise at least one group of TSV arrays that includes at least one TSV.

According to one exemplary embodiment of the present disclosure, the selection circuit is further configured to transmit, the first detection control signal to the control terminal of the first switching circuit arranged on the selected one or more groups of M chip layers, and transmit the second detection control signal to the control terminal of the third switching circuit corresponding to the selected one or more groups of N TSV arrays.

According to one exemplary embodiment of the present disclosure, the TSV detecting circuit may further comprise a first detecting TSV, comprising a first terminal coupled to the control terminal of the first switching circuit, and a second terminal coupled to a first detection control signal output of the selection circuit, and a second detecting TSV comprising a first terminal coupled to the control terminal of the third switching circuit, and a second terminal coupled to a second detection control signal output terminal of the selection circuit.

According to one exemplary embodiment of the present disclosure, the first detecting TSV includes M first detecting TSVs, wherein the first terminals of the M first detecting TSVs are respectively coupled to control terminals of the first switching circuits in the M chip layers. The selection circuit may be configured to transmit, the first detection control signal to the second terminals of the first detecting TSVs of the selected one or more groups of M chip layers.

According to one exemplary embodiment of the present disclosure, the second detecting TSV may include N second detecting TSVs, wherein the first terminals of the N second detecting TSVs are respectively coupled to control terminals of the third switching circuits in the N TSV arrays. The selection circuit may be configured to transmit, the second detection control signal to the second terminal of the second detecting TSVs of the selected one or more groups of N TSV arrays.

According to one exemplary embodiment of the present disclosure, the comparison circuit and the N output circuits may be disposed on a bottom chip layer of the integrated circuit, or on a top chip layer of the integrated circuit and the top chip layer may be a chip layer that is farthest from a bottom chip layer among a plurality of chip layers of the integrated circuit.

A second aspect of the present disclosure may be directed to a TSV detecting method using the TSV detecting circuit. The method may comprise turning on a first switching circuit by a first detection control signal, and transmitting a first power signal to a first input of a comparison circuit via the first switching circuit and a TSV, transmitting a reference signal to a second input of the comparison circuit, and determining whether the TSV is faulty by comparing signals input into the first input and the second input of the comparison circuit.

According to one exemplary embodiment of the present disclosure, when a difference between the signals input into the first input and the second input of the comparison circuit is within a predetermined range, the TSV may be determined as not faulty. When the difference between the signals input into the first input and the second input of the comparison circuit is out of the predetermined range, the TSV may be determined as faulty.

According to one exemplary embodiment of the present disclosure, the method may further comprise adjusting the first power signal and parameters of the first switching circuit, such that a signal input into the TSV is the same as the reference signal.

A third aspect of the present disclosure may be directed to an integrated circuit comprising the above TSV detecting circuit.

The TSV detecting circuit disclosed by the present disclosure may transmit, by controlling the first switching circuit to be turned on and according to the first detection control signal, a first power signal of the first terminal of the first switching circuit to a first terminal of a comparison circuit via a TSV coupled to a second terminal of the first switching circuit. The TSV detecting circuit may also transmit a reference signal to the second terminal of the comparison circuit, then compare signals input into the first input and the second input of the comparison circuit. If the signals input into the first input and the second input of the comparison circuit are different, determining that the TSV may have s a fault, thereby realizing a connectivity detection of the TSVs and providing a simple structure suitable for a large-scale integrated circuit.

It is to be understood that both the foregoing summary and the following detailed description are exemplary and explanatory only and are not restrictive of the present disclosure.

BRIEF DESCRIPTION OF THE DRAWINGS

The above and other features and advantages of the present disclosure will become more apparent according to the detailed description of the embodiments with reference to accompany drawings.

FIG. 13 is a schematic diagram of a selection circuit according to an embodiment of the present disclosure.

FIG. 14 is a flowchart of a TSV detecting method according to an embodiment of the present disclosure.

Figure 1A:
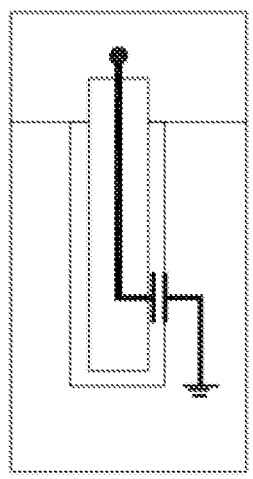
FIG. 1a is a schematic diagram of a TSV without a fault.

In these figures:
100, an input circuit;
110, a first switching circuit;
120, a third switching circuit;
200, a comparison circuit;
300, a TSV;
400, an output circuit;
410, a flip-flop;
420, a second switching circuit;
500, a selection circuit;
600, a first detecting TSV;
700, a second detecting TSV;
VDD, a first power signal;
Vref, a reference signal;
DCS1, a first detection control signal;
DCS2, a second detection control signal;
CLK, a clock signal; and
OCS, an output control signal.

DETAILED DESCRIPTION

Exemplary embodiments will now be described more fully with reference to the accompanying drawings. However, these exemplary embodiments can be implemented in many forms and should not construe limitations to those set forth. Rather, these embodiments are presented to provide a full and thorough understanding of the present invention and to fully convey the concepts of the exemplary embodiments to others skilled in the art. Throughout the figures, like reference numerals indicate identical or similar elements, so any duplicate description of them will be omitted.

In addition, the described features, structures, and characteristics may be combined in any suitable manner in one or more embodiments. In the following detailed description, many specific details are set forth to provide a more thorough understanding of the present disclosure. However, those skilled in the art will recognize that the various embodiments can be practiced without one or more of the specific details or with other methods, components, materials, or the like. In some instances, well-known structures, materials, or operations are not shown or not described in detail to avoid obscuring aspects of the embodiments.

The represented blocks in the figures are functional entities, which may not necessarily correspond to physically separate entities. In other words, these functional entities may be implemented as software, or entirely or in part in one or more software-hardened modules, or in different networks and/or processor devices and/or microcontroller devices.

Figure 1B:
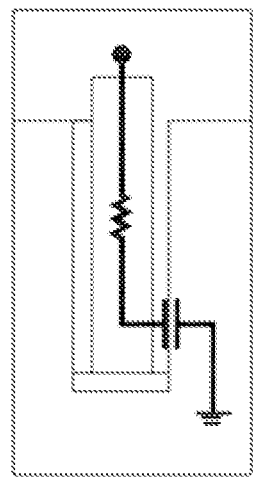
FIG. 1b is a schematic diagram of a TSV with a resistive open fault.
Figure 1C:
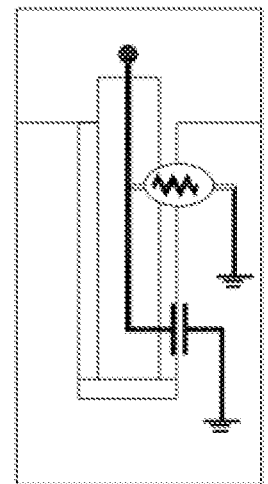
FIG. 1c is a schematic diagram of a TSV with a leakage fault.

In the related art, a non-fault TSV is shown in FIG. 1a. However, the TSV may have a resistive open fault as shown in FIG. 1b, or a leakage fault as shown in FIG. 1c. When there is a resistive open fault or leakage fault in the TSV, the signal passing through the TSVs may change.

Figure 2:
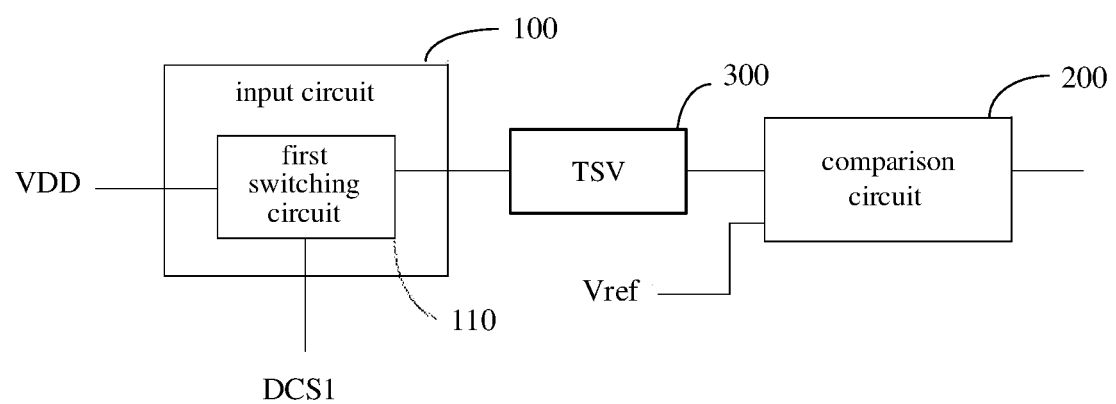
FIG. 2 is a schematic diagram of a TSV detecting circuit according to a first embodiment of the present disclosure.

In the embodiment of the present disclosure, a through-silicon via (TSV) detecting circuit is disclosed. As shown in FIG. 2, the TSV detecting circuit may include an input circuit 100 and a comparison circuit 200. The input circuit 100 may include a first switching circuit 110 and the comparison circuit 200. The first switching circuit 110 may comprise a control terminal coupled to a first detection control signal DCS1, a first terminal coupled to a first power terminal, and a second terminal coupled to a first terminal of the TSV, and may be configured to be turned on in response to the first detection control signal DCS1 to transmit a first power signal VDD to the first terminal of the TSV. The comparison circuit 200 may comprise a first input coupled to a second terminal of the TSV and a second input coupled to a reference signal, to compare a signal of the second terminal of the TSV and the reference signal Vref.

The comparison circuit 200 may be configured to compare the reference signal Vref and the signal passing through the TSV. In practical applications, the signal input into the TSV may be the same as the reference signal Vref by adjusting the voltage of the first power signal VDD and the parameters of the first switching circuit 110. The signal passing through the TSV is input into the first input of the comparison circuit 200, and the reference signal Vref is input into the second input of the comparison circuit 200. The comparison circuit 200 compares the signals input into the first input and the second input. If the signals are the same, the TSV may be determined to have no fault. Otherwise, the TSV may be determined to have a fault. When the difference between the signals at the first input and the second input of the comparison circuit 200 is within a predetermined range, the signals at the first input and second input of the comparison circuit 200 may be considered to be the same.

The TSVs described in the embodiments of the present disclosure may be TSVs that connect adjacent chip layers (dies), or may be series-connected TSVs that connects non-adjacent chip layers (dies), which is not specifically limited in the embodiments.

The TSV detecting circuit disclosed in the present disclosure, by controlling the first switching circuit 110 to be turned on according to the first detection control signal DCS1, may transmit a first power signal VDD of the first terminal of the first switching circuit 110 to a first terminal of a comparison circuit 200, via a TSV coupled to a second terminal of the first switching circuit 110. A reference signal Vref is transmitted to the second terminal of the comparison circuit 200. The comparison circuit 200 compares the signals input into the first input and the second input thereof. If the signals input into the first input and the second input of the comparison circuit 200 are different, the TSV may be determined to have a fault to realize the connectivity detection of the TSV. The TSV detecting circuit has a simple structure and is suitable for large scales integrated circuits.

Since the TSVs are configured to connect different dies, the input circuit 100 may be disposed on a first die, the comparison circuit 200 may be disposed on a second die, and the first die and the second die are connected through the TSVs.

Figure 3:
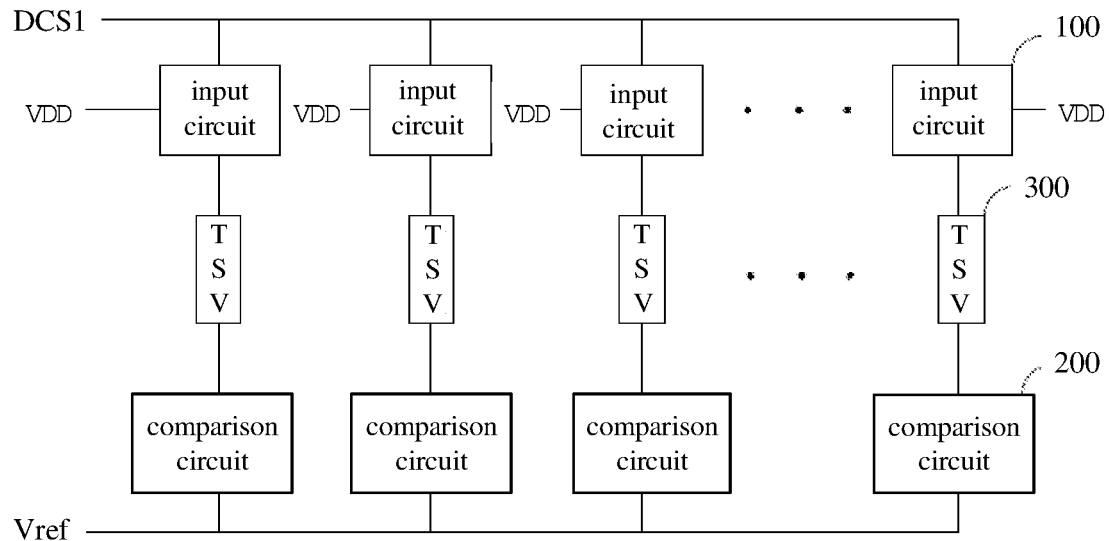
FIG. 3 is a schematic diagram of a TSV detecting circuit according to a second embodiment of the present disclosure.

As shown in FIG. 3, when N TSVs are disposed on a die, the die may be configured with N input circuits 100. Each input circuit 100 is coupled to a first terminal of a corresponding TSV in a TSV array, wherein a second terminal of the corresponding TSV is coupled to the first input of the comparison circuit 200. The N TSVs in the TSV array may comprise a plurality of TSVs connected in series.

Accordingly, N comparison circuit 200 may be provided. Each of the N comparison circuits 200 may have a first input coupled to the second terminal of the corresponding TSV of the TSV array and a second input coupled to the reference signal Vref.

Figure 4:
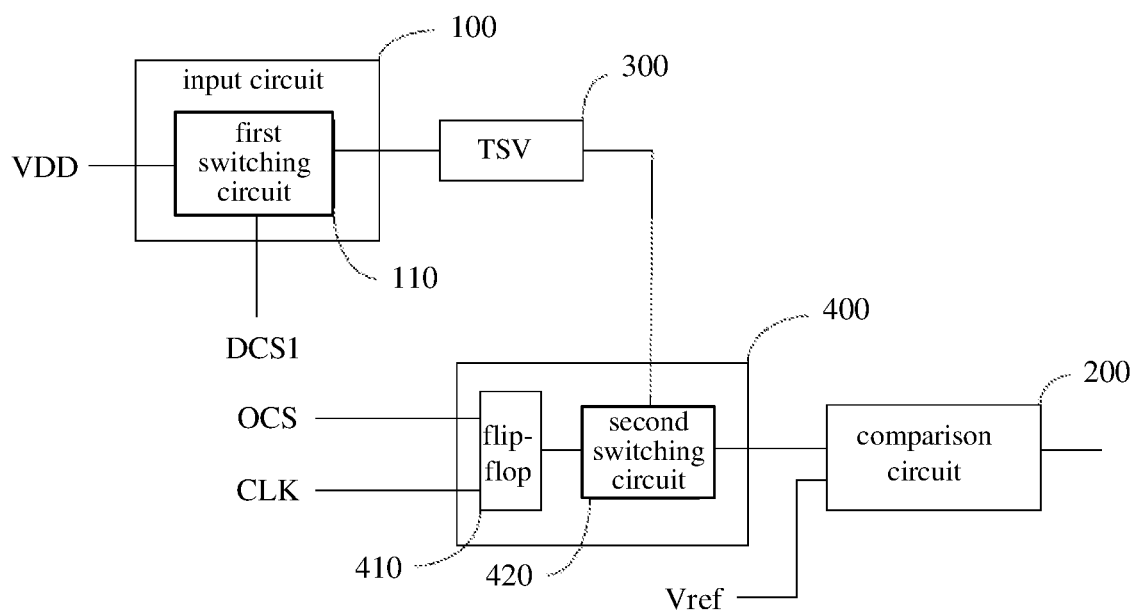
FIG. 4 is a schematic diagram of a TSV detecting circuit according to a third embodiment of the present disclosure.

In addition, as shown in FIG. 4, the TSV detecting circuit may further include an output circuit 400 disposed between the TSV and the comparison circuit 200. As shown in FIG.

12, the output circuit 400 may include a flip-flop 410 and a second switching circuit 420. The flip-flop 410 is connected to the output control signal OCS, the clock signal terminal CLK, and the first node. The flip-flop 410 is configured to transmit the output control signal OCS to the first node in response to the clock signal CLK. The second switching circuit 420 is coupled to the second terminal of the corresponding TSV in the TSV array, the output of the flip-flop 410, and the first input of the comparison circuit 200. The second switching circuit 420 is configured to be turned on in response to a signal output by the flip-flop 410 to transmit a signal of the second terminal of the corresponding TSV in the TSV array to the first input of the comparison circuit 200.

The comparison circuit 200 and the output circuit 400 may be disposed on base die of an integrated circuit, or on a top die of an integrated circuit. The top die is a die that is farthest from a base die among a plurality of dies. That is, the second die can be the bottom layer or the top layer of the 3D integrated circuit (etc., a bottom core die or a top core die). When the second die is the bottom layer of the 3D integrated circuit, the comparison circuit 200 is located at the bottom layer, then a bottom-up detection of the TSV is allowed. When the second die is the top layer of the 3D integrated circuit, the comparison circuit 200 is located on the top layer, then a top-down detection of the TSV is allowed.

The flip-flop 410 transmits the output control signal OCS to the control terminal of the second switching circuit 420 to turn on the second switching circuit 420 under the control of the clock signal CLK. The second switching circuit 420 transmits the signal of the second terminal of the TSV to the first input of the comparison circuit 200. The input of the flip-flop 410 can be connected to an AND gate. The output control signal OCS and a detection enable signal EN are respectively input into the two inputs of the AND gate. When the detection enable signal EN is "1", the output control signal OCS is input into the flip-flop 410.

Figure 5:
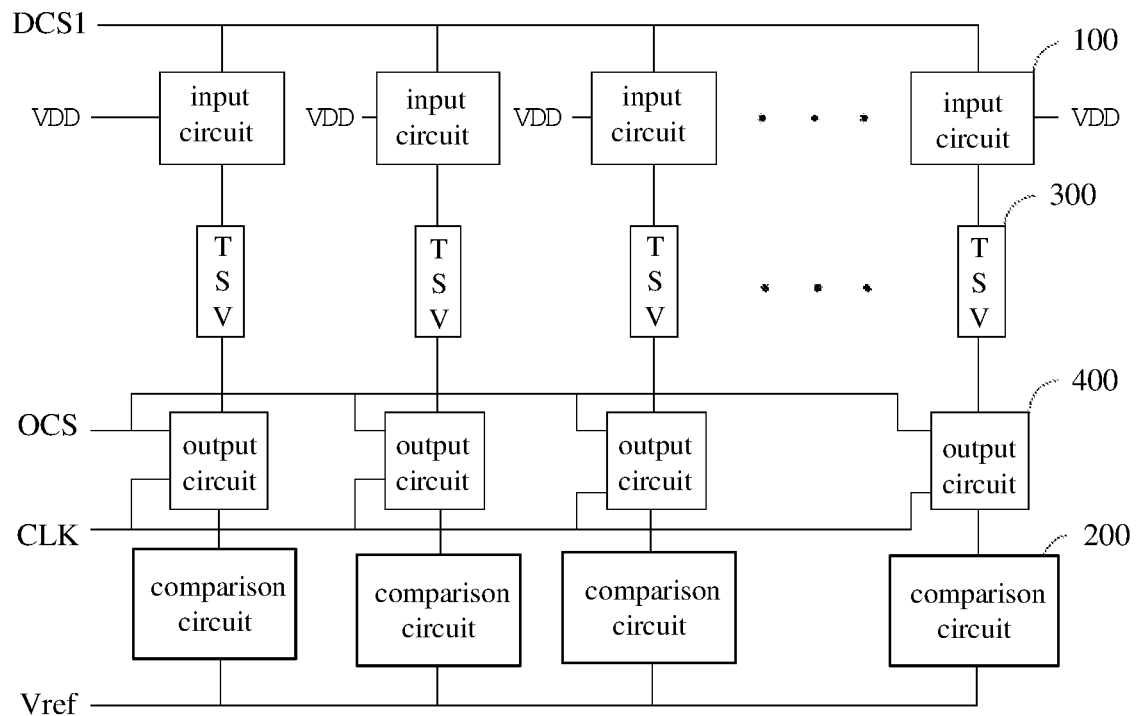
FIG. 5 is a schematic diagram of a TSV detecting circuit according to a fourth embodiment of the present disclosure.

Further, as shown in FIG. 5, when the TSV detecting circuit includes N input circuits 100, the TSV detecting circuit may further include N output circuits 400. A first terminal of the second switching circuit 420 of each of the N output circuits 400 is respectively coupled to the second terminal of the corresponding TVS of the TSV array, and a second terminal of the second switching circuit 420 of each of the N output circuits 400 is coupled to the first input of the corresponding comparison circuit 200.

Figure 6:
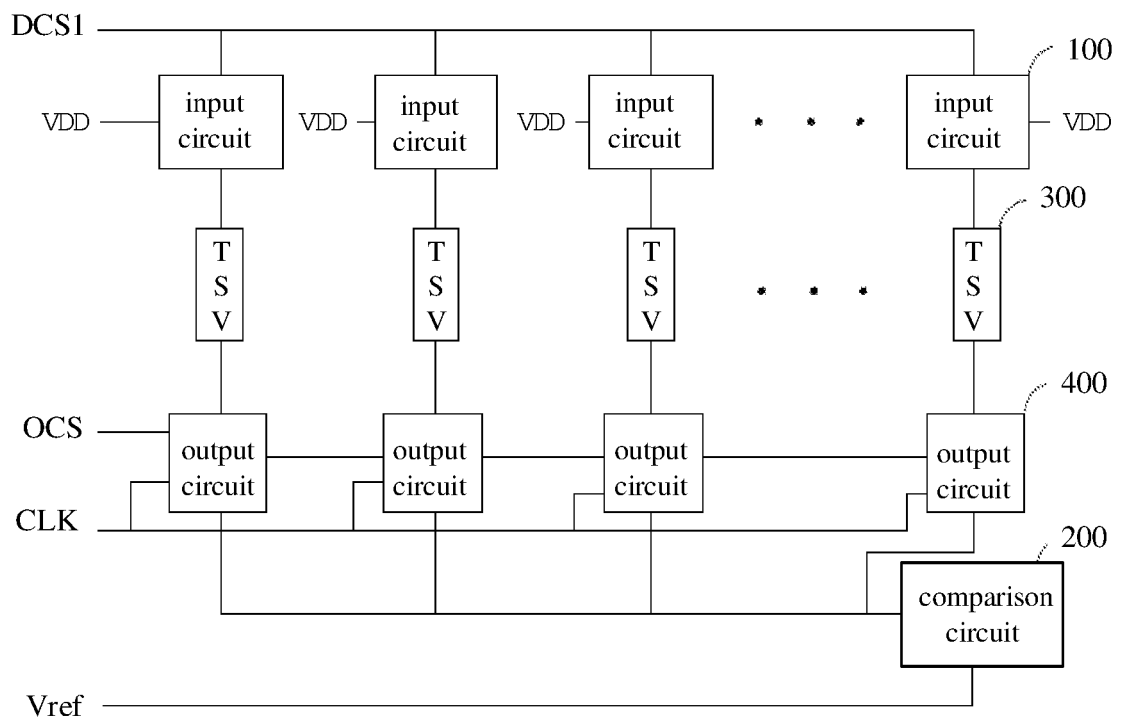
FIG. 6 is a schematic diagram of a TSV detecting circuit according to a fifth embodiment of the present disclosure.
Figure 9:
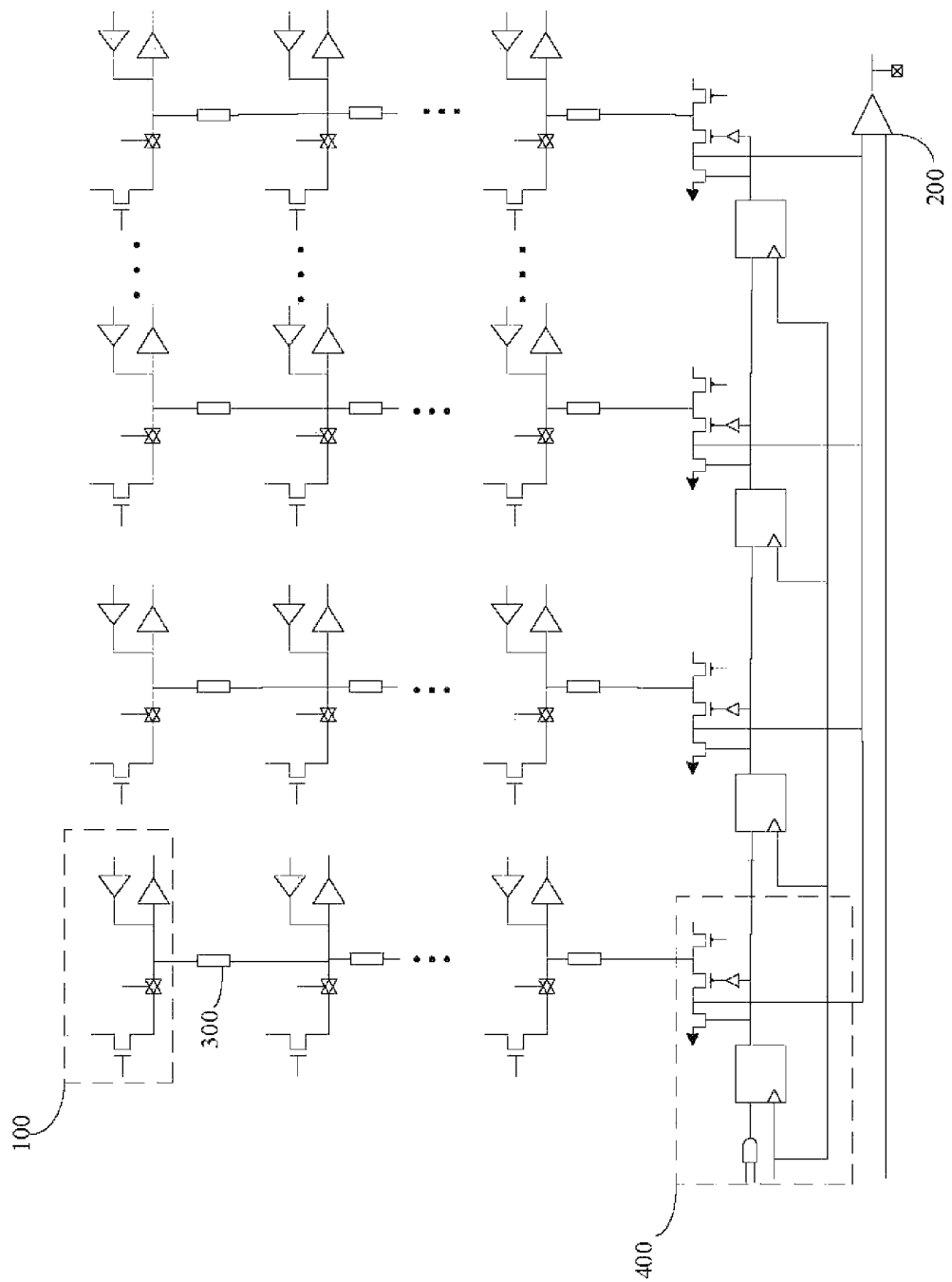
FIG. 9 is a schematic diagram of a TSV detecting circuit according to an eighth embodiment of the present disclosure.

In an embodiment of the present disclosure, as shown in FIG. 6 and FIG. 9, the TSV detecting circuit may include one comparison circuit 200. The second terminals of the N second switching circuits 420 are coupled to a first input of the comparison circuit 200, and a second input of the comparison circuit 200 is coupled to the reference signal Vref. The second terminal of the second switching circuit 420 of each of the N output circuits 400 is coupled to the first input of the comparison circuit 200. The N output circuits 400 are arranged according to the connect order of corresponding TSVs in the TSV arrays, such that an output of the flip-flop of each output circuit 400 is connected to an input of the flip-flop of an immediately succeeding output circuit 400, and the input of the flip-flop of the first output circuit 400 in the output circuit sequence is connected to the output control signal OCS. The scan chain formed by the flip-flops 410 of the plurality of output circuits 400 sequentially output the output control signal OCS, under the control of the clock signal CLK, to turn on the second switching circuit 420. The signal of the TSV corresponding to the second switching circuit 420 is transmitted to the first input of the comparison circuit 200, and the connectivity of the TSV is sequentially detected, which reduces the number of comparison units in the circuit, simplifies the circuit structure, and reduces the cost.

Figure 7:
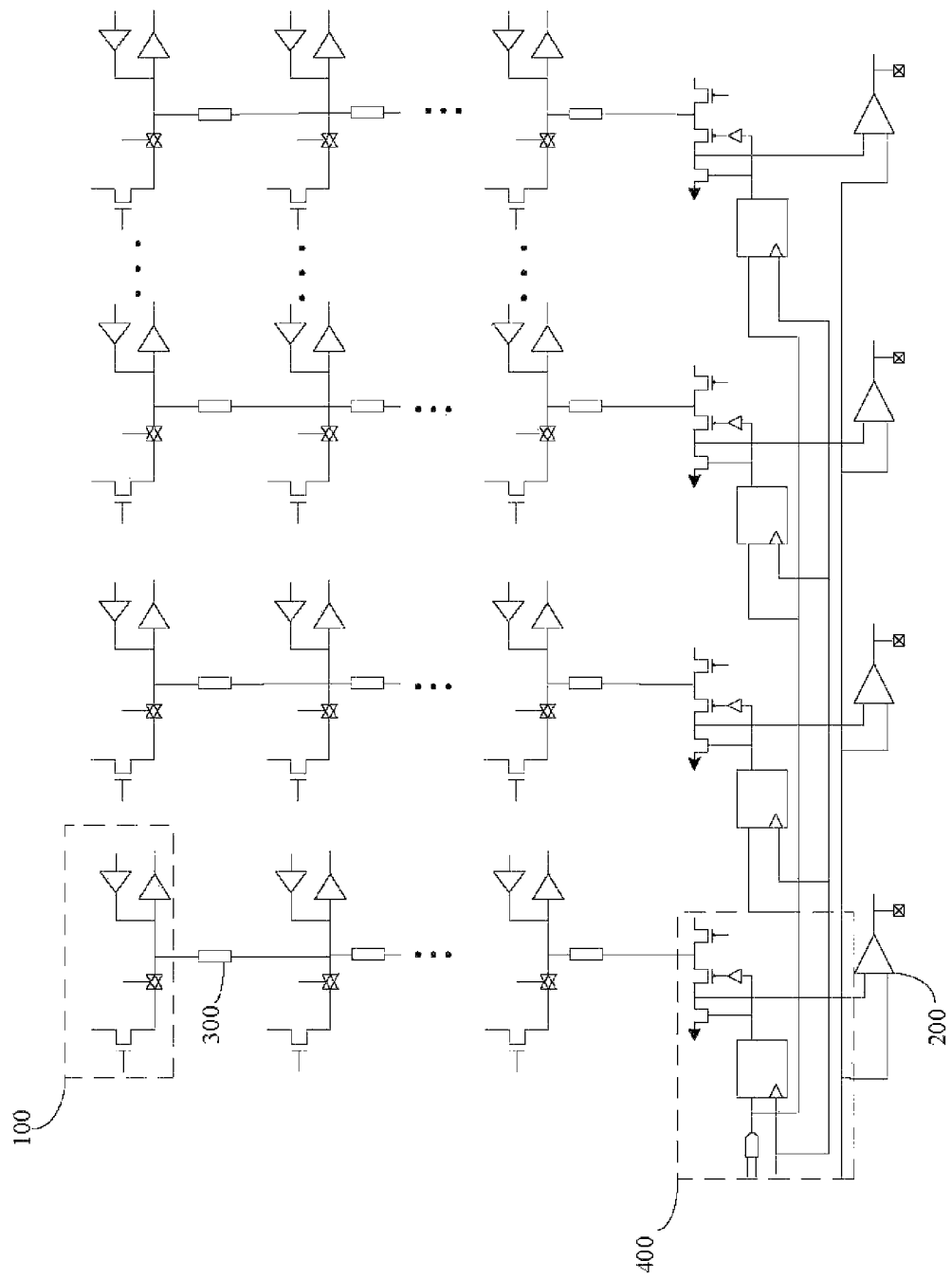
FIG. 7 is a schematic diagram of a TSV detecting circuit according to a sixth embodiment of the present disclosure.

In an embodiment of the present disclosure, as shown in FIG. 5 and FIG. 7, the TSV detecting circuit may include N comparison circuits 200. The second terminal of each of the N second switching circuits 420 is coupled to the first input of a corresponding comparison circuit 200, and the second terminal of each of the N comparison units 200 is coupled to the reference signal Vref. The input of the flip-flop of each of the N output circuits 400 is coupled to the output control signal OCS. Each of the output circuits 400 is correspondingly connected to a comparison circuit 200. Thus, the detection results are intuitive, convenient for subsequent analysis, and simple to control.

Figure 11:
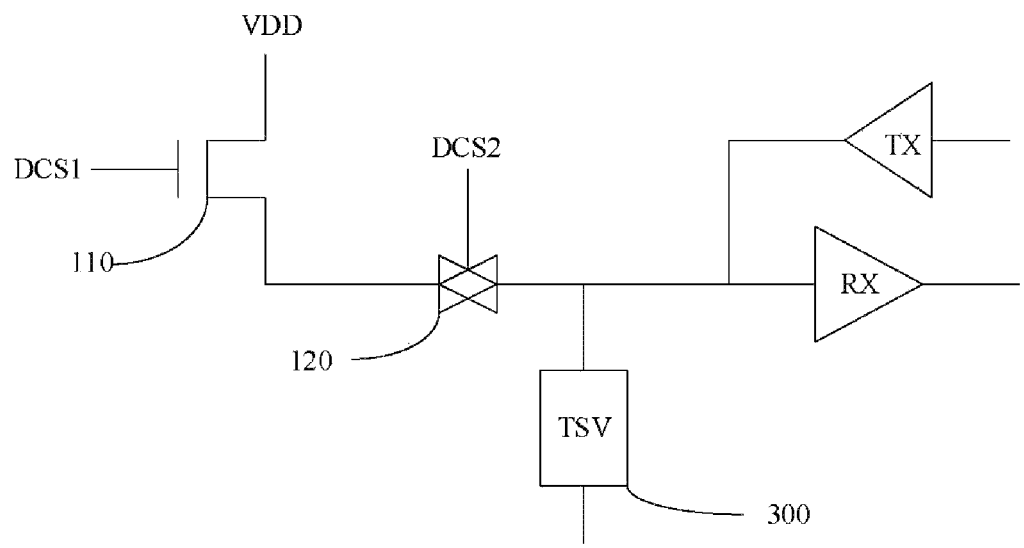
FIG. 11 is a schematic diagram of an input circuit according to an embodiment of the present disclosure.
Figure 12:
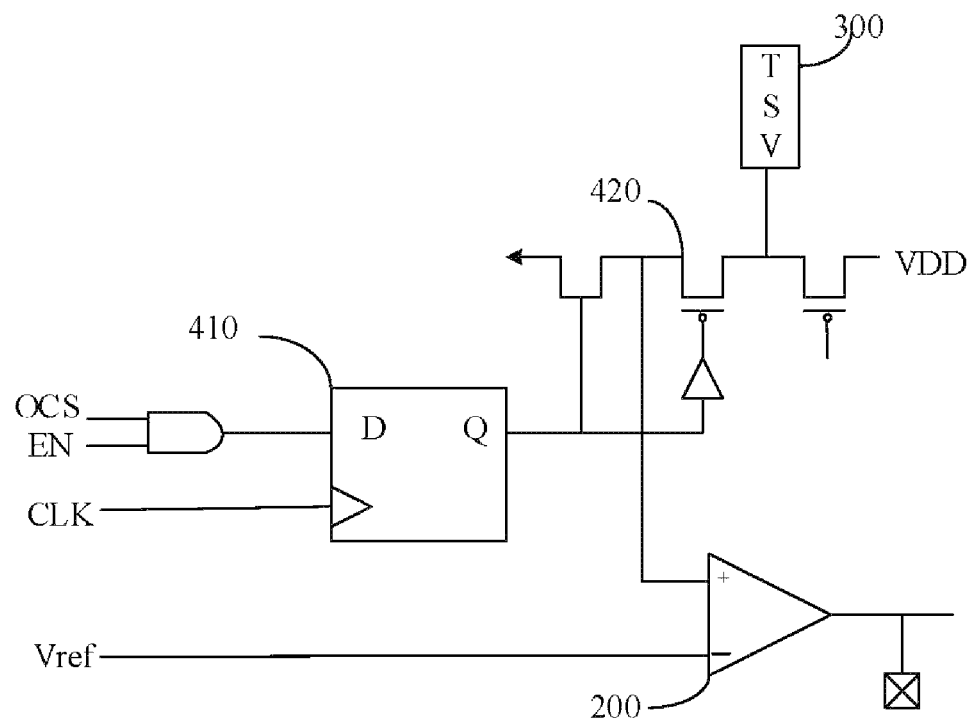
FIG. 12 is a schematic diagram of an output circuit according to an embodiment of the present disclosure.

Further, as shown in FIG. 11, the input circuit 100 may further include a third switching circuit 120 comprising a control terminal coupled to a second detection control signal DCS2, a first terminal coupled to the second terminal of the first switching circuit 110, and a second terminal coupled to the first terminal of the TSV 300. The third switching circuit 120 is configured to be turned on in response to the second detection control signal DCS2 to transmit a signal of the second terminal of the first switching circuit 110 to the first terminal of the TSV 300. When the first switching circuit 110 and the third switching circuit 120 are simultaneously turned on, the first power signal VDD is input into the TSV 300.

In practical applications, a 3D integrated circuit may comprise a plurality of layers (etc., dies) stacked on each other, and the connection of adjacent layers requires a plurality of TSVs. As shown in FIG. 7, in order to detect an integrated circuit comprising M layers each comprising N TSVs, the TSV detecting circuit may comprise M*N input circuits 100, and each of them coupled to the first terminal of the TSV 300. The M*N TSVs form N TSV arrays, and each of the N TSV arrays has M TSVs connected in series. The second terminal of each of the TSV arrays is coupled to a corresponding output circuit. The first terminal of each TSV array is a signal input, and the second terminal of each TSV array is a signal output.

The comparison circuit 200 can be disposed on the bottom layer or the top layer of the 3D integrated circuit (etc., a bottom core die or a top core die). By providing the first detection control signal DCS1 to the first switching circuits 110 of one or more of the M layers, and the second detection control signal DCS2 to the third switching circuits 120 of one or more corresponding TSV arrays, one or more TSV arrays can be detected or a portion of the TSVs in the TSV array can be selected for detection.

For example, for a 3D integrated circuit having a structure with four layers (etc., four core dies), four TSVs may be disposed in adjacent layers. The input circuit 100 is connected to the upper terminal of each TSV 300, and the output circuit 400 and the comparison circuit 200 may be located on the bottom layer. The first detection control signal DCS1 may be transmitted to the control terminal of the first switching circuit 110 in the third layer, and the second detection control signal DCS2 may be transmitted to the third switching circuit 120 corresponding to the TSV array of the second column. Therefore, the TSV between the third layer and the fourth layer in the TSV array of the second column may be tested.

Figure 8:
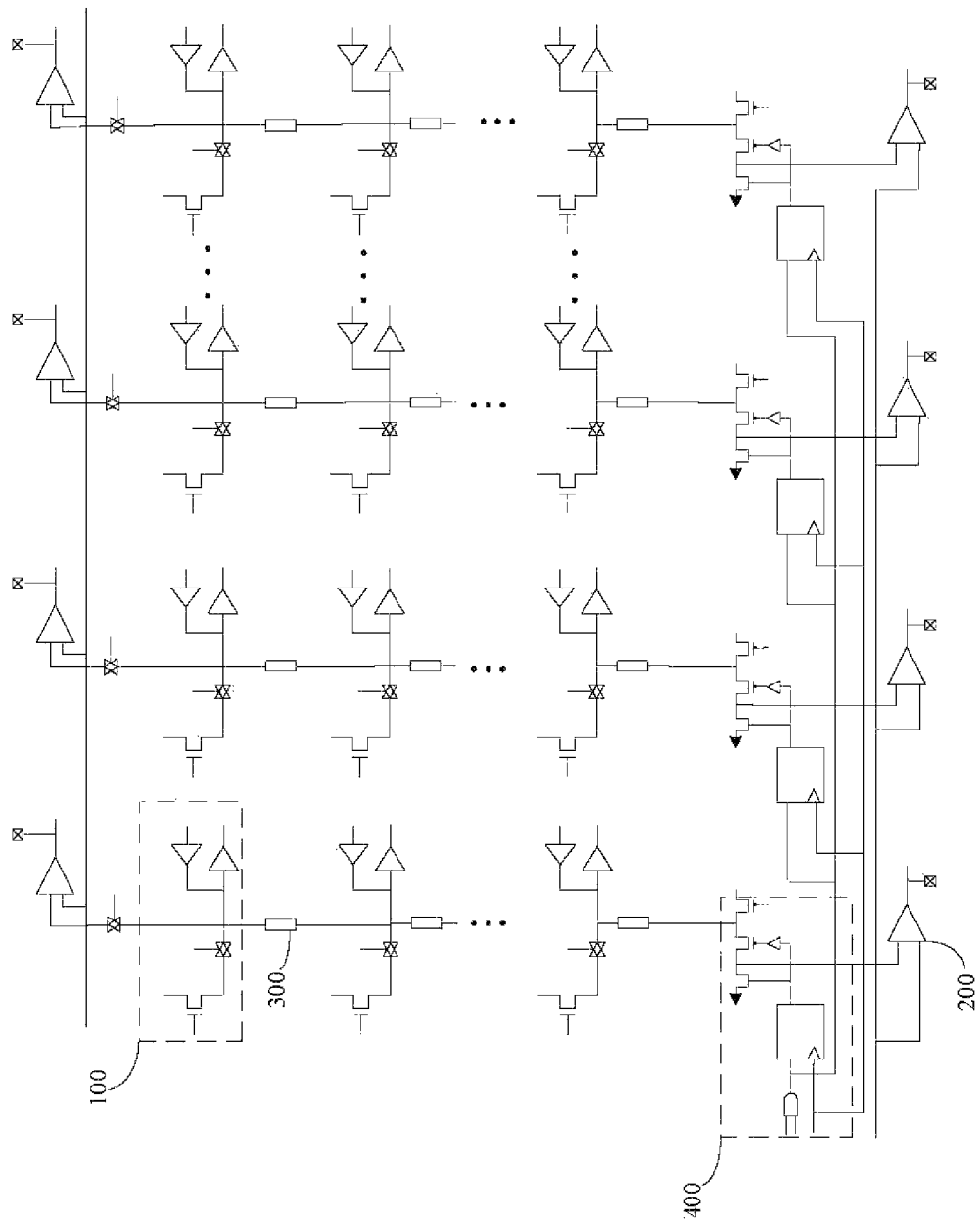
FIG. 8 is a schematic diagram of a TSV detecting circuit according to a seventh embodiment of the present disclosure.

Further, as shown in FIG. 8, the comparison circuit 200 may be disposed on each of the bottom layer and the top layer of the integrated circuit, that is, the comparison circuit 200 is connected to each the terminal of the TSV array. The first input of the comparison circuit 200 on the bottom layer is connected to bottom terminal of the TSV array through the output circuit 400, and the first input of the comparison circuit 200 on the top layer is connected to the top terminal of the TSV array through the fourth switching circuit. The fourth switching circuit is turned on in response to the control signal so as to transmit the signal on the TSV array to the comparison circuit 200, and the second input of each of the comparison circuits 200 is coupled to the reference signal Vref. Thus, the top-down test or the bottom-up test can be selected according to the test requirements. The top-down test uses the comparison circuit 200 on the bottom layer, and the bottom-up test uses the comparison circuit 200 on the top layer.

Figure 10:
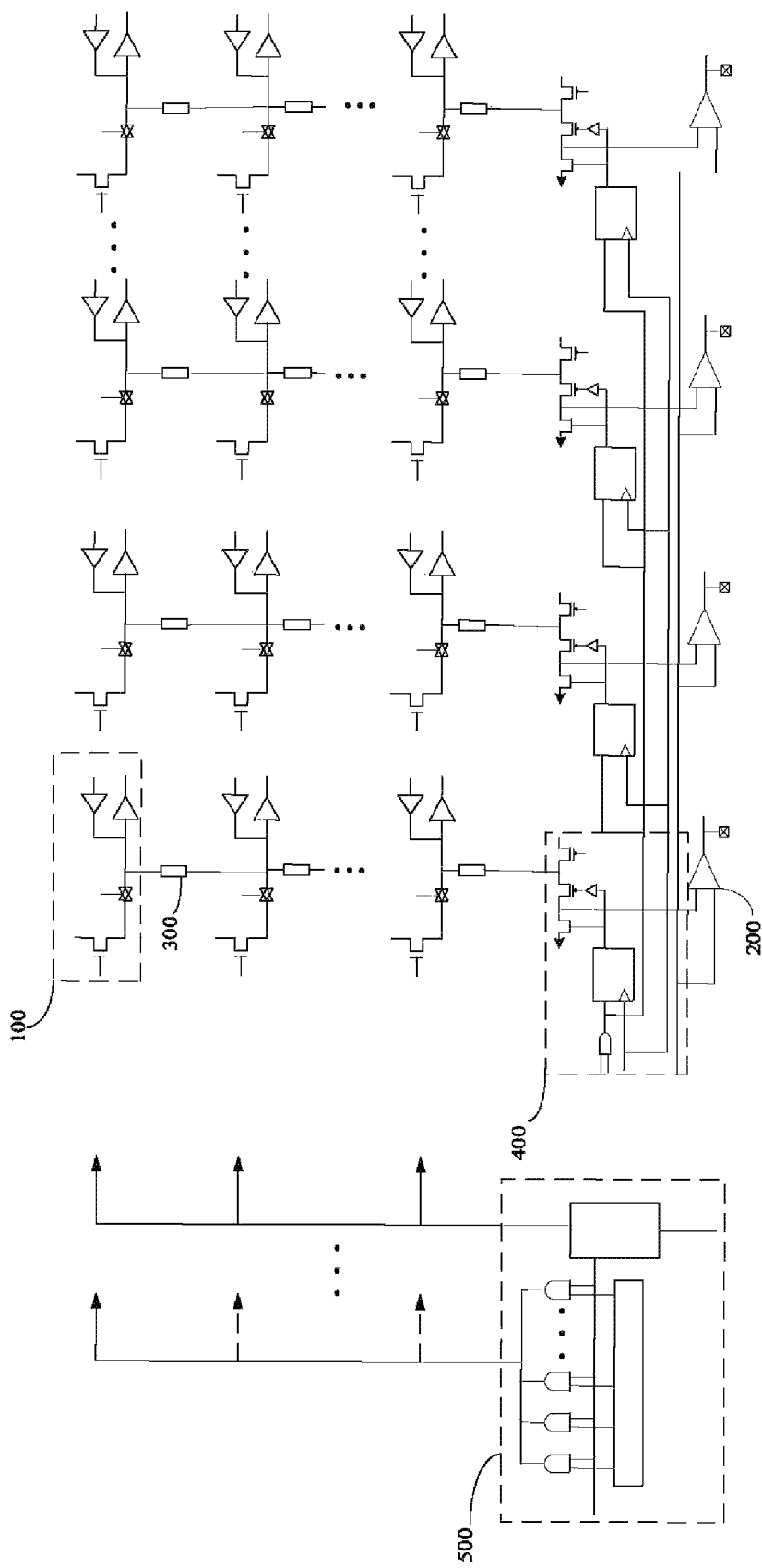
FIG. 10 is a schematic diagram of a TSV detecting circuit according to a ninth embodiment of the present disclosure.

In order to transmit the first detection control signal DCS1 to the control terminal of the corresponding first switching circuit 110, and to transmit the second detection control signal DCS2 to the control terminal of the corresponding third switching circuit 120, as shown in FIGS. 10 and 13, the TSV detecting circuit may further include a selection circuit 500, configured to select, according to a selection control signal, one or more groups of M chip layers and one or more groups of N TSV arrays, wherein the M chip layers comprise at least one group of chip layers that includes at least one chip layer, and wherein the N TSV arrays comprise at least one group of TSV arrays that includes at least one TSV array. The selection circuit may be further configured to transmit, according to the selected one or more groups of M chip layers and the selected one or more groups of N TSV arrays, the first detection control signal DCS1 to the control terminals of the first switching circuits 110 arranged on the selected one or more groups of M layers, and transmit the second detection control signal DCS2 to the control terminals of the third switching circuits 120 corresponding to the selected one or more groups of N TSV arrays. In this manner, the M layers may be grouped and detected in groups, and the N TSV arrays may be grouped and detected in groups. Each group of the M layers may comprise at least one layer and up to M layers, and each group of the N TSV arrays may comprise at least one TSV array and up to N TSV arrays.

The selection circuit 500 may include a first selection circuit and a second selection circuit. The first selection circuit is configured to select control terminals of the first switching circuits for transmitting the first detection control signal DCS1 to one of the plurality of layers. The second selection circuit is configured to select the control terminals of the corresponding third switching circuits 120 for transmitting the second detection control signal DCS2 to one of the N TSV arrays.

The first selection circuit and the second selection circuit may be a selector, which may transmit the input signal to one of the plurality of output terminals by selecting a control signal. Each output of the selector in the first selection circuit may be connected to one terminal of a corresponding AND gate, and the other terminal of the AND gate is coupled to the detection enable signal EN.

For example, the TSVs in the 3D integrated circuit can be numbered according to the layers in which they are located and positions in each layer. For example, the TSVs can be numbered as shown in Table 1. According the corresponding numeration, the selection circuit 500 transmits the first detection control signal DCS1 to the first switching circuit 110 and the second detection control signal DCS2 to the third switching circuit 120 connected to the corresponding TSV.

TABLE 1

| 11 | 12 | 13 | 14 | ... | 1N |
| 21 | 22 | 23 | 24 | ... | 2N |
| 31 | 32 | 33 | 34 | ... | 3N |
| ... | ... | ... | ... | ... | ... |
| M1 | M2 | M3 | M4 | ... | MN |

Further, the TSV detecting circuit may include a first detecting TSV 600 and a second detecting TSV 700. One terminal of the first detecting TSV 600 is coupled to the first detection control signal DCS1 output from the selecting module 500. The other terminal of the first detecting TSV 600 is coupled to the control terminal of the first switching circuit 110. One terminal of the second detecting TSV 700 is coupled to the second detection control signal DCS2 output from the selection circuit 500, and the other terminal is coupled to the control terminal of the third switching circuit 120. The first detecting TSV 600 is configured to transmit the first detection control signal DCS1 to the control terminal of the corresponding first switching circuit 110, and the second detecting TSV 700 is configured to transmit the second detection control signal DCS2 to the control terminal of the corresponding third switching circuit 120.

The TSV detecting circuit may include M first detecting TSVs 600, wherein a first terminal of each of the first detecting TSVs 600 is coupled to the control terminal of one of a plurality of first switching circuits 110 in one layer. According to the selection control signal, the selection circuit 500 transmits a first detection control signal DCS1 to a second terminal of the first detecting TSV 600. Each of the M first detecting TSVs 600 is connected to a layer, and the control terminal of the first switching circuit 110 of each of the input circuits 100 of the layer is connected to the first detecting TSV 600.

The TSV detecting circuit may include N second detecting TSVs 700, wherein a first terminal of each of the second detecting TSVs 700 is coupled to the control terminal of one of a plurality of third switching circuits corresponding to one TSV array. According to the selection control signal, the selection circuit 500 transmits the second detection control signal DCS2 to a second terminal of the second detecting TSV 700. Each of the N second detecting TSVs 700 is connected to a TSV array, and the control terminal of the second switching circuit 420 of each of the plurality of output circuits 400 corresponding to the TSV array is connected to the second detecting TSV 700.

It should be noted that the first detecting TSV 600 and the second detecting TSV 700 described in the embodiments of the present disclosure are also TSVs without fault. The first switching circuit 110, the second switching circuit 420, and the third switching circuit 120 described in the embodiments of the present disclosure may be transistors, or elements such as transmission gates. The first terminal and the second terminal of the TSV are respectively referred to as the two terminals of the TSV. The first terminal may be the upper terminal or the lower terminal, which is not specifically limited in the embodiment of the present disclosure. In the embodiments of the present disclosure, M and N are positive integers greater than or equal to 1.

The TSV detecting circuit disclosed in the embodiments of the present disclosure can coordinate with the repairing circuit to increase the reliability of the TSVs. The TSV detecting circuit of the present disclosure can detect faulty TSVs, and then replace the faulty TSVs by the repairing circuit in the related art, particularly by the TSVs provided by the redundancy mechanism.

In the embodiment of the present disclosure, a TSV detecting method is further disclosed. As shown in FIG. 14, the TSV detecting method may include following steps.

In step S1, a first switching circuit 110 is turned on by using a first detection control signal DCS1, so that a first power signal VDD is transmitted to a first input of a comparison circuit 200 via the first switching circuit 110 and a TSV.

In step S2, a reference signal Vref is transmitted to a second input of the comparison circuit 200.

In step S3, signals input into the first input and the second input of the comparison circuit 200 are compared to determine whether the TSV is faulty.

The embodiment of the present disclosure may further disclose an integrated circuit including the above-described TSV detecting circuit. Of course, the integrated circuit may also include components such as a PCB, a capacitor, or a resistor, which will not be described in the embodiments of the present disclosure herein.

It should be noted that, although the various steps of the TSV detecting method of the present disclosure are described in a particular order in the drawings, this does not require or imply that the steps must be performed in the specific order, or all the steps shown must be performed in order to achieve the desired results. Additionally or alternatively, certain steps may be omitted, multiple steps may be combined into one step for execution, and/or one step may be decomposed into multiple steps for executions and the like.

Further, the figures are merely illustrative description of a series of processes included in the method according to embodiments of the present disclosure and do not construe limitations. It will be appreciated that the way in which the processes are illustrated does not indicate any chronological order of them nor limit them to a particular chronological order. Furthermore, it will also be appreciated that the processes may be performed, for example, synchronously or asynchronously in multiple modules.

Other embodiments of the present disclosure may be apparent to those skilled in the art from considering the specification and practicing the invention disclosed herein. Accordingly, the present disclosure covers all and any variations, uses, or adaptations of the present disclosure following the general principles thereof and including any common knowledge or customary practice of the art to which the present disclosure pertains. The specification and examples are exemplary only. The true scope and spirit of the present disclosure are indicated by the appended claims.

It is to be understood that the present disclosure is not limited to the exact structures as described above and illustrated in the figures, and may be modified or changed without departing from its scope. The scope of the present disclosure is defined by the appended claims.

What is claimed is:

1. A through-silicon via (TSV) detecting circuit, comprising:
   an input circuit including a first switching circuit, wherein the first switching circuit comprises a control terminal coupled to a first detection control signal, a first terminal coupled to a first power signal, and a second terminal coupled to a first terminal of a TSV, and is configured to be turned on in response to the first detection control signal to transmit the first power signal to the first terminal of the TSV; and
   a comparison circuit comprising a first input coupled to a second terminal of the TSV, and a second input coupled to a reference signal, wherein the comparison circuit is configured to compare a signal of the second terminal of the TSV and the reference signal.

2. The TSV detecting circuit of claim 1, wherein the input circuit is disposed on a first chip layer of an integrated circuit, the comparison circuit is disposed on a second chip layer the integrated circuit, and the first chip layer and the second chip layer are connected through the TSV.

3. The TSV detecting circuit of claim 2, wherein the first chip layer is provided with N input circuits and N TSV arrays, each of the N input circuits is coupled to a first terminal of each of the N TSV arrays, a second terminal of each of the N TSV arrays is coupled to the first input of the comparison circuit, and each of the N TSV arrays comprises at least a TSV.

4. The TSV detecting circuit of claim 3, further comprising:
   N output circuits, each of the N output circuits comprising a second switching circuit, a first terminal of the second switching circuit of each of the N output circuits coupled to the second terminal of each of the N TSV arrays, and a second terminal of the second switching circuit of each of the N output circuits coupled to the first input of the comparison circuit.

5. The TSV detecting circuit of claim 4, wherein the comparison circuit comprises N comparison circuits, each of the N comparison circuits comprises a first input coupled to the second terminal of each of the N TSV arrays and a second input coupled to the reference signal.

6. The TSV detecting circuit of claim 4, wherein each of the N output circuits comprises a flip-flop coupled to an output control signal, a clock signal, and a first node, and is configured to transmit the output control signal to the first node in response to the clock signal, and the second switching circuit is coupled to the first node and is configured to be turned on in response to an output signal of the flip-flop to transmit a signal of the second terminal of each of the N TSV arrays to the first input of the comparison circuit.

7. The TSV detecting circuit of claim 6, wherein an output of the flip-flop of each of the N output circuits is connected to an input of the flip-flop of an immediately succeeding output circuit.

8. The TSV detecting circuit of claim 5, wherein an input of the flip-flop of each of the N output circuits is coupled to the output control signal.

9. The TSV detecting circuit of claim 5, wherein the comparison circuit and the N output circuits are disposed on:
   a bottom chip layer of the integrated circuit, or
   a top chip layer of the integrated circuit, wherein the top chip layer is a chip layer that is farthest from the bottom chip layer among a plurality of chip layers of the integrated circuit.

10. The TSV detecting circuit of claim 3, further comprising:
    M*N input circuits, each of the M*N input circuits coupled to the first terminal of each of M*N TSVs,
    wherein the M*N TSVs include the N TSV arrays, each of the N TSV arrays has M TSVs connected in series, the M TSVs in each of the N TSV arrays are respectively disposed on M chip layers of the integrated circuit, and the second terminal of each of the N TSV arrays is coupled to an output circuit,
    and wherein the first terminal of each of the N TSV arrays is an input, and the second terminal of each of the TSV arrays is an output.

11. The TSV detecting circuit according to claim 1, wherein the input circuit comprises:
a third switching circuit comprising a control terminal coupled to a second detection control signal, a first terminal coupled to the second terminal of the first switching circuit, and a second terminal coupled to the first terminal of the TSV, wherein the third switching circuit is configured to be turned on in response to the second detection control signal to transmit a signal of the second terminal of the first switching circuit to the first terminal of the TSV.

12. The TSV detecting circuit of claim 11, further comprising:
a selection circuit configured to select, according to a selection control signal, one or more groups of M chip layers and one or more groups of N TSV arrays, wherein the M chip layers comprise at least one group of chip layers that includes at least one chip layer, and wherein the N TSV arrays comprise at least one group of TSV arrays that includes at least one TSV.

13. The TSV detecting circuit of claim 12, wherein the selection circuit is further configured to transmit, the first detection control signal to the control terminal of the first switching circuit arranged on the selected one or more groups of M chip layers, and transmit the second detection control signal to the control terminal of the third switching circuit corresponding to the selected one or more groups of N TSV arrays.

14. The TSV detecting circuit of claim 13, further comprising:
a first detecting TSV, comprising a first terminal coupled to the control terminal of the first switching circuit, and a second terminal coupled to a first detection control signal output of the selection circuit; and
a second detecting TSV, comprising a first terminal coupled to the control terminal of the third switching circuit, and a second terminal coupled to a second detection control signal output terminal of the selection circuit.

15. The TSV detecting circuit of claim 14, wherein:
the first detecting TSV includes M first detecting TSVs, wherein the first terminals of the M first detecting TSVs are respectively coupled to control terminals of the first switching circuits in the M chip layers; and
the selection circuit is configured to transmit, the first detection control signal to the second terminals of the first detecting TSVs of the selected one or more groups of M chip layers.

16. The TSV detecting circuit of claim 14, wherein:
the second detecting TSV includes N second detecting TSVs, wherein the first terminals of the N second detecting TSVs are respectively coupled to control terminals of the third switching circuits in the N TSV arrays; and
the selection circuit is configured to transmit, the second detection control signal to the second terminal of the second detecting TSVs of the selected one or more groups of N TSV arrays.

17. An integrated circuit comprising a through-silicon via (TSV) detecting circuit, wherein the TSV detecting circuit comprises:
an input circuit including a first switching circuit, the first switching circuit comprising a control terminal coupled to a first detection control signal, a first terminal coupled to a first power signal, and a second terminal coupled to a first terminal of a TSV, wherein the first switching circuit is configured to be turned on in response to the first detection control signal to transmit the first power signal to the first terminal of the TSV; and
a comparison circuit comprising a first input coupled to a second terminal of the TSV, and a second input coupled to a reference signal, wherein the comparison circuit is configured to compare a signal of the second terminal of the TSV and the reference signal.

18. A through-silicon via (TSV) detecting method, applicable to a TSV detecting circuit,
wherein the TSV detecting circuit comprises:
an input circuit including a first switching circuit, wherein the first switching circuit comprises a control terminal coupled to a first detection control signal, a first terminal coupled to a first power signal, and a second terminal coupled to a first terminal of a TSV, and is configured to be turned on in response to the first detection control signal to transmit the first power signal to the first terminal of the TSV; and
a comparison circuit comprising a first input coupled to a second terminal of the TSV, and a second input coupled to a reference signal, wherein the comparison circuit is configured to compare a signal of the second terminal of the TSV and the reference signal,
and wherein the method comprises:
turning on the first switching circuit by the first detection control signal, and supplying the first power signal to the first terminal of the first switching circuit to cause a TSV input signal to be supplied to the first terminal of the TSV;
transmitting a TSV output signal on the second terminal of the TSV to the first input of the comparison circuit;
transmitting the reference signal to the second input of the comparison circuit; and
determining, by comparing the reference signal with the TSV output signal, whether the TSV is faulty.

19. The TSV detecting method of claim 18, wherein determining whether the TSV is faulty comprises:
determining, in response to a difference between the reference signal and the TSV output signal within a predetermined range, the TSV is not faulty; and
determining, in response to the difference between the reference signal and the TSV output signal outside of the predetermined range, the TSV is faulty.

20. The TSV detecting method of claim 18, further comprising:
adjusting the first power signal and parameters of the first switching circuit, to cause the TSV input signal to be the same as the reference signal.

* * * * *